(12) United States Patent
Redlich et al.

(10) Patent No.: US 9,146,277 B2
(45) Date of Patent: Sep. 29, 2015

(54) TEST BOARD AND TEST SYSTEM (75) Inventors: Stefan Redlich, Duisburg (DE); Niels Schademann, Duesseldorf (DE); Uwe Schmidinghoff, Essen (DE)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 12/267,187

(22) Filed: Nov. 7, 2008

(65) Prior Publication Data
US 2010/0117668 A1 May 13, 2010

(51) Int. Cl.
| G01R 31/00 | (2006.01) |
| G01R 31/319 | (2006.01) |
| G01R 31/302 | (2006.01) |
| G01R 21/12 | (2006.01) |
| G01R 31/28 | (2006.01) |

(52) U.S. Cl.
CPC ...... *G01R 31/31905* (2013.01); *G01R 31/3025* (2013.01); *G01R 21/12* (2013.01); *G01R 31/2822* (2013.01)

(58) Field of Classification Search
USPC .......................... 324/754–765, 158.1; 714/724
See application file for complete search history.

(56) References Cited

U.S. PATENT DOCUMENTS

| 5,652,524 A  * | 7/1997 | Jennion et al. ........... 324/756.07 |
| 6,040,691 A  * | 3/2000 | Hanners et al. .......... 324/756.07 |
| 6,331,770 B1 * | 12/2001 | Sugamori .................. 324/750.3 |
| 6,397,160 B1 * | 5/2002 | Craig et al. .................... 702/120 |
| 7,383,478 B1 | 6/2008 | Ballagh et al. |
| 2004/0119487 A1 * | 6/2004 | Song et al. ..................... 324/758 |
| 2004/0246013 A1 * | 12/2004 | Dejima ......................... 324/760 |
| 2006/0020867 A1 * | 1/2006 | Evans .......................... 714/742 |
| 2006/0038579 A1 * | 2/2006 | Guthrie et al. ................ 324/765 |
| 2007/0214392 A1 * | 9/2007 | Franco et al. .................... 714/43 |

FOREIGN PATENT DOCUMENTS

| DE | 60128014 T2 | 1/2008 |
| EP | 1296148 A1 | 3/2003 |
| EP | 1473573 A1 | 11/2004 |
| WO | WO 2005/081994 A2 | 9/2005 |

OTHER PUBLICATIONS

Brown, et al., "RF Testing on a Mixed Signal Tester", ITC International Test Conference, IEEE, 2004, p. 793-800.
Akbay, et al., "Low-Cost Test of Embedded RF/Analog/Mixed-Signal Circuits in SOPs", IEEE Transactions on Advanced Packaging, vol. 27, No. 2, May 2004, p. 352-363.
Ferrario, et al., "A Low-Cost TeSt Solution for Wireless Phone RFICs", IEEE Communications Magazine, Sep. 2003, p. 82-88.

* cited by examiner

*Primary Examiner* — Paresh Patel
(74) *Attorney, Agent, or Firm* — Eschweiler & Associates, LLC

(57) ABSTRACT

The test board includes at least one first interface configured to electrically connect the test board with a test controller, at least one second interface configured to electrically connect the test board with at least one electrical device to be tested, respectively. The test board further includes at least one electrical component, and a bus system electrically connected to the first interface and one or more of the second interface and the electrical component.

25 Claims, 5 Drawing Sheets

TEST BOARD AND TEST SYSTEM

FIELD OF THE INVENTION

The present invention relates to a test board and a test system.

BACKGROUND OF THE INVENTION

Electronic devices like integrated circuits (ICs) and IC packages are analyzed for various characteristics as, for example, DC and AC characteristics and/or tested for defects. In particular, integrated radio frequency devices and circuits are analyzed for their performance at different radio frequencies. In order to accomplish such analysis, a test board is used to support an electronic device under test (DUT) and to electrically connect the DUT with a test controller via suitable interface connections. The test controller generally includes a computer that has various stored test programs or test information developed by design or test engineers specifically for the DUT. The tests carried out may include functional tests, such as diagnostic tests and stress tests, for ensuring that the functionality of the integrated circuit is complete, and structural tests for ensuring that no structural faults exist in the DUT.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily too scale relative to each other. Like reference numerals designate corresponding similar parts.

DETAILED DESCRIPTION OF THE INVENTION

The aspects and embodiments of the invention are now described with reference to the drawings, wherein like reference numerals are generally utilized to refer to like elements throughout. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of the specific details. In other instances, known structures and devices are shown in block diagram form in order to facilitate describing one or more aspects of the embodiments of the invention. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled", "connected", "electrically coupled" or "electrically connected" are not meant to mean that the elements must be directly coupled or connected together and that instead intervening elements may be provided between the "coupled" or "connected" or "electrically coupled" or "electrically connected" elements.

Figure 1:
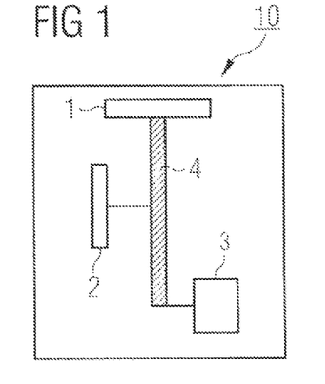
FIG. 1 schematically illustrates a top view of a test board according to an embodiment.

Referring to FIG. 1, there is shown a schematic representation of a test board according to an embodiment. The test board 10 comprises at least one first interface 1 to electrically connect the test board 10 with a test controller (not shown), at least one second interface 2 to electrically connect the test board 10 with at least one electrical device to be tested (not shown), respectively, at least one electrical component 3, and a bus system 4 electrically connected with the first interface 1, the second interface 2 and the electrical component 3. In one embodiment, the bus system 4 can be comprised of a single bus line as depicted in the embodiment of FIG. 1. The bus system 4 can also be arranged such that it only connects the first interface 1 with the second interface 2 or the first interface 1 with the electrical component 3. In this alternative embodiment the second interface 2 may be electrically connected with the electrical component 3 by a separate electrical connection line or a plurality of separate electrical connection lines independent from the bus system 4.

According to an embodiment of the test board 10 of FIG. 1, the test board 10 comprises a plurality of first interfaces 1 to electrically connect the test board 10 with a test controller.

According to an embodiment of the test board 10 of FIG. 1, the first interface 1 is arranged as an electrical socket or plug system comprising an array or arrangement of plugs or sockets. The electrical plug or socket system can be arranged on one of the main surfaces of the test board 10 as shown in FIG. 1. In case of a plurality of first interfaces 1 they can be arranged on one or both of the main surfaces of the test board 10.

According to an embodiment of the test board 10 of FIG. 1, a plurality of second interfaces 2 can be arranged, and electrically connected with the bus system 4 so that a respective plurality of electrical devices can be tested wherein each one of the electrical devices can be connected with a respective one of the plurality of the second interfaces 2. The at least one second interface 2 can be comprised of an array or arrangement of plugs or sockets to be connected with electrical connectors of an electronic device to be tested.

According to an embodiment of the test board 10 of FIG. 1, the at least one second interface 2 can be arranged on one of the main surfaces of the test board 10 as shown in FIG. 1. In case of a plurality of second interfaces 2, they can be arranged on one and the same main surface of the test board 10 or they can also be arranged on both of the main surfaces of the test board 10.

According to an embodiment of the test board 10 of FIG. 1, a, plurality of electrical components 3 is connected with the bus system 4. The at least one electrical component 3 can be arranged on one of the main surfaces of the test board 10. In case of a plurality of electrical components 3, they can be arranged on one and the same main surface of the test board 10 or they can be arranged on both of the main surfaces of the test board 10. In particular, the electrical components 3 can be arranged on one of the main surfaces of the test board 10 and that of the at least one second interface 2, and alternatively the electrical device to be tested can be arranged on the respective other main surface of the test board 10.

According to an embodiment of the test board 10 of FIG. 1, the at least one electrical component 3 can be connected with a third interface, the third interface being connected with the bus system 4. The third interface can be comprised of an array or arrangement of electrical plugs or sockets. The at least one third interface can be arranged on one of the main surfaces of the test board 10 and in case of a plurality of the third interfaces they can be arranged on one and the same main surface of the test board 10, or on both of the main surfaces of the test board.

According to an embodiment of the test board 10 of FIG. 1, the electrical component 3 comprises a radio frequency (RF) transmitter/receiver module. The module can be one of a transmitter module, a receiver module or a combined transmitter and receiver module, i.e. a transceiver module. The module can be used to either generate RF frequency signals to be transmitted to an electrical device to be tested, the electrical device being connected to the second interface 2. The module can also detect radio frequency signals generated by an electrical device to be tested. The module may thus comprise one or both of RF transmitters and RF detectors. Furthermore, the module may comprise memory elements for storing data, in particular calibration data obtained in calibrating one or both of a transmitter and detector of the module.

According to an embodiment of the test board 10 of FIG. 1, the test board 10 comprises a plurality of electrical components 3, the plurality of electrical components 3 being a plurality of radio frequency (RF) transmitter/receiver modules as described before. The modules can be arranged, for example, on one of the main surfaces of the test board 10.

According to an embodiment of the test board 10 of FIG. 1, the bus system 4 is arranged such that a bus protocol like, for example, a standardized bus protocol like I²C is implemented on the bus system 4 so that addressing of the different components on the test board 10 is possible. The bus protocol can be implemented by software functions and programs running on the test controller wherein the software functions are designed to image at least one standardized bus protocol onto the bus system. One or more of standardized bus protocols like I²C or hotwire can be implemented in such a way.

According to an embodiment of the test board 10 of FIG. 1, the at least one electrical component 3 is a software programmable electrical component. In particular, test programs or test runs stored in the test controller can be programmed into the electrical components 3 in order to test an electronic device connected to the second interface 2 in a predetermined manner and to report results of the test to the test controller. Furthermore, in case of an RF transmitter/receiver module as the electrical component, the module can be programmed such that it is able to carry out a self-test for calibration purposes. The self-test includes for example, controlling of a transmitter to generate and transmit radio frequency signals of predetermined frequency and signal strength and to detect the signals with a radio frequency detector and to store respective calibration values with respect to a comparison between adjusted and measured frequency and strength values.

Figure 2:
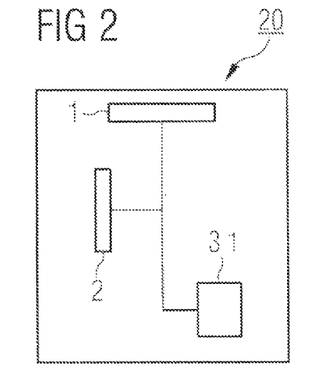
FIG. 2 schematically illustrates a top view of a test board according to an embodiment.

Referring to FIG. 2, there is shown a schematic representation of a test board according to an embodiment. The test board 20 of FIG. 2 comprises at least one first interface 1 to electrically connect the test board 20 with a test controller (not shown), at least one second interface 2 to electrically connect the test board 20 with at least one electrical device to be tested (not shown), respectively, and at least one radio frequency (RF) transmitter/receiver module 3.1.

The RF module can be a transmitter nodule, a receiver module or a combined transmitter and receiver module, i.e. a transceiver module.

According to an embodiment of the test board 20 of FIG. 2, the test board 20 further comprises a bus system electrically connected with the first interface 1 and one or more of the second interface 2 and the RF transmitter/receiver module 3.1.

According to an embodiment of the test board 20 of FIG. 2, the test board 20 further comprises a plurality of RF transmitter/receiver modules 3.1.

According to an embodiment of the test board 20 of FIG. 2, the test board 20 further comprises at least one third interface connected with the at least one RF transmitter/receiver module 3.1.

According to an embodiment of the test board 20 of FIG. 2, the RF transmitter/receiver module 3.1 is a software programmable RF transmitter/receiver module 3.1.

It should be noted that further embodiments of the test board 20 of FIG. 2 can be created by making use of one or more of the features, as described in connection with the test board 10 of FIG. 1.

Figure 3:
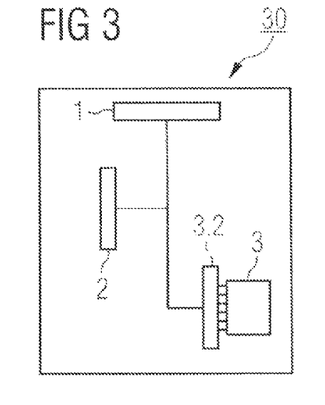
FIG. 3 schematically illustrates a top view of a test board according to an embodiment.

Referring to FIG. 3, there is shown a schematic representation of a test board according to an embodiment. The test board 30 of FIG. 3 comprises at least one first interface 1 to electrically connect the test board 30 with a test controller (not shown), at least one second interface 2 to electrically connect the test board 30 with at least one electrical device to be tested (not shown), respectively, and at least one third interface 3.2 electrically connected with at least one electrical component 3, respectively, wherein the second interface 2 and the third interface 3.2 are electrically connected with each other.

According to an embodiment of the test board 30 of FIG. 3, the test board 30 further comprises a bus system electrically connected with the first interface 1 and one or more of the second interface 2 and the third interface 3.2.

According to an embodiment of the test board 30 of FIG. 3, the electrical component 3 comprises a radio frequency (RF) transmitter/receiver module which can be a transmitter module, a receiver module, or a transceiver module. In particular, it can be implemented as a software programmable RE transmitter/receiver module.

According to an embodiment of the test board 30 of FIG. 3, the test board 30 comprises a plurality of electrical components 3, said plurality of electrical components 3 comprising a respective plurality of RF transmitter/receiver modules.

It is to be noted that further embodiments of the test board 30 of FIG. 3 can be formed with one or more of the features of the embodiments of test boards 10 and 20 as shown in FIGS. 1 and 2.

Figure 4A:
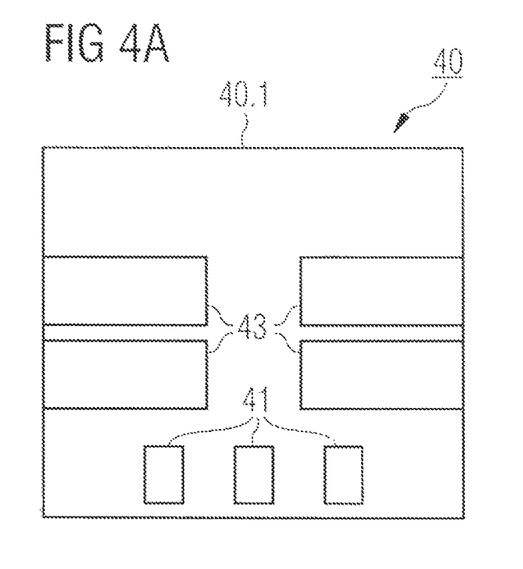
FIGS. 4A and 4B schematically illustrate a top view (A) and a down view (B) of a test board according to an embodiment.
Figure 4B:
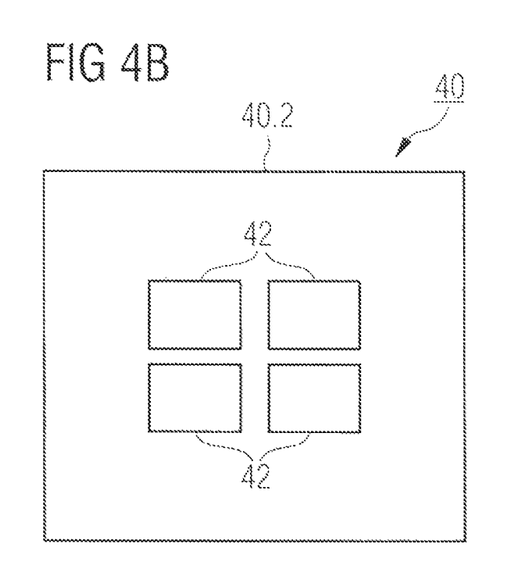

Referring to FIGS. 4A and 4B there are shown schematic representations of a test board according to an embodiment in a top view (FIG. 4A) and a bottom view (FIG. 4B). The test board 40 itself is comprised of a circuit board fabricated of, for example, a laminate material and it can, for example, be a printed circuit board (PCB), in particular a printed circuit board wherein both main surfaces form metallization planes and comprise printed electrical wire connections. The test board 40 can also be comprised of a multilayer printed circuit board wherein metallization planes are formed on both main surfaces and also in one or more planes within board.

The test board 40 comprises a first main surface 40.1 as shown in the top view of FIG. 4A and a second main surface 40.2 as shown in the bottom view of FIG. 4B. On the first main surface 40.1 a plurality of RF transmitter/receiver modules 43 are arranged wherein the modules 43 are electrically connected with respective electrical interfaces (not shown) on the first main surface 40.1 of the test board 40. The electrical interfaces are comprised of electrical socket systems connected with a bus system (not shown), respectively, and the electrical interfaces are arranged in a regular manner so that the modules 43 can also be arranged in a regular manner as shown in FIG. 4A.

On the second main surface 40.2 a plurality of electrical devices 42 is arranged wherein the electrical devices 42 are electrically connected with respective second electrical interfaces (not shown) on the first main surface 40.1 of the test board 40. In one embodiment, the second electrical interfaces are comprised of electrical socket systems connected with the bus system, respectively, and the electrical interfaces are arranged in a regular manner so that the electrical devices 42 can also be arranged in a regular manner as shown in FIG. 4B.

The test board 40 of FIGS. 4A and 4B also comprises a plurality of first electrical interfaces 41 arranged on the first main surface 40.1 in the form of a regular arrangement along one of the side edges of the first main surface 40.1. If desired or necessary there can be provided even more first interfaces 41 and they can be provided also on the second main surface 40.2. The test board 40 also comprises a bus system (not shown), in particular a bus line which can be arranged on one or both of the main surfaces 40.1 and 40.2 wherein electrical via connections in the test board 40 serve for interconnecting bus lines on both surfaces or for providing electrical connections between a bus line on one surface and one or more electrical components on a respective other surface of the test board 40.

Figure 5:
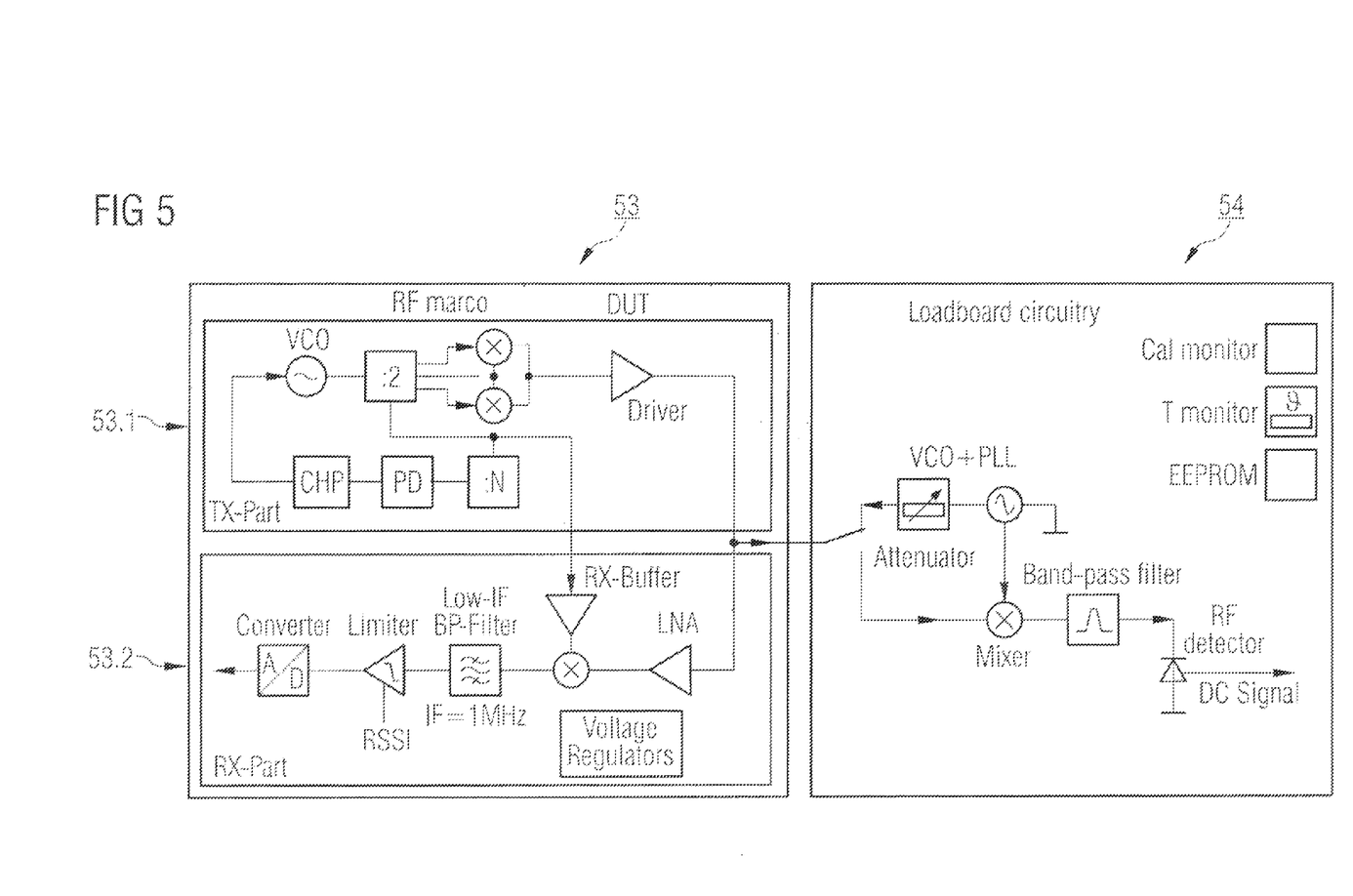
FIG. 5 schematically illustrates an exemplary device under test (DUT) and an embodiment of a test board circuitry.

Referring to FIG. 5, there is shown a schematic representation of an electrical device circuit and a test board circuit for illustrating a test concept. In one embodiment, the electrical device under test (DUT) 53 is a radio frequency (RF) transceiver device comprising a transmitter or TX part 53.1 and a receiver or RX part 53.2. In one embodiment, the DUT 53 is connected with a so-called loadboard comprising a loadboard circuitry 54. The term loadboard is used here as a synonym to the term test board and the loadboard circuitry can be given as a circuitry implemented directly on the test board or loadboard or it can be given by a radio frequency (RF) transmitter/receiver module such as that described in connection with FIGS. 4A and 4B and designated with reference number 43. For such a module the term riderboard will also used in this application.

When connecting the DUT 53 to an interface as provided on the test board, an output node of the DUT 53 will be connected to a bus system of the loadboard and the bus system is connected with thee loadboard circuitry 54. If the loadboard circuitry 54 is part of and implemented on a riderboard or module, such module will be connected with an interface such as the interface 3.2 of the embodiment of FIG. 3, wherein the interface is connected with the bus system. Therefore electrical signals can be transmitted between the DUT 53 and the loadboard circuitry 54. In one embodiment, the loadboard circuitry 54 comprises a voltage controlled oscillator (VCO) and a phase-locked loop (PLL) for generating a radio frequency. Furthermore the loadboard circuitry 54 comprises a mixer, a bandpass filter and an RF detector, the RF detector generating a DC signal out of the RF signal according to well-known RF-to-DC direct conversion electronics.

During a test program or test run the TX part 53.1 of the DUT 53 is driven to generate a radio frequency (RF) signal and the RF signal is transmitted over the bus system to the loadboard circuitry 54. The loadboard circuitry 54 comprises an input/output node and a switch connected to the input/output node. The switch connects the input/output node with either one of two branches of the loadboard circuitry 54 based on whether a signal is received from the DUT 53 or a signal is transmitted to the DUT 53.

According to a first mode the loadboard circuitry 54 is used to test the TX part 53.1 of the DUT 53 in which case a signal is sent from the TX part 53.1 of the DUT 53 to the loadboard circuitry 54 and the position of the switch is such that the input/output node of the loadboard circuitry 54 is connected with a receiving path of the loadboard circuitry 54. The receiving path of the loadboard circuitry 54 contains the mixer, the band-pass filter and the RF detector. The mixer also receives a frequency signal from the PLL for down-converting the incoming RF signal, for example, to an intermediate frequency. The down-converted RF signal is then filtered in the band-pass filter and supplied to the RF detector. The RF detector provides a DC output signal which is representative of the power of the RF signal generated at the TX part 53.1 of the DUT 53. The DC signal is transmitted to the test controller where it is evaluated.

According to a second mode the loadboard circuitry 54 is used to test the RX part 53.2 of the DUT 53 in which case a radio frequency (RF) signal is generated at the loadboard circuitry 54 and transmitted to the RX part 53.2 of the DUT 53 and the position of the switch is such that the input/output node of the loadboard circuitry 54 is connected with a transmitting path of the loadboard circuitry 54. In the transmitting path a radio frequency (RF) signal can be generated be means of an RF source comprised of a phase-locked loop (PLL) together with a voltage, controlled oscillator (VCO). The RF signal can be variably attenuated by a controllable attenuator. The RF signal is then output and fed onto the bus system and supplied to the RX part 53.2 of the DUT 53. In the RX part 53.2 the signal strength can be measured by, for example, an RSSI (radio signal strength indication) detector.

The loadboard circuitry 54 also comprises a calibration monitor for monitoring a calibration status as will be outlined in more detail further below, a temperature monitor for monitoring an environmental temperature, and a memory like, for example, an EEPROM, for storing calibration data, temperature data and, if desired, other measurement data.

Figure 6:
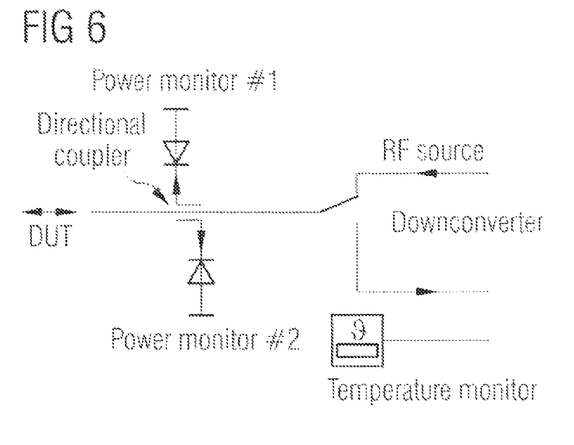
FIG. 6 schematically illustrates an embodiment of a test board circuitry for calibration purposes and self-test functionality.

Referring to FIG. 6, there is shown a test board circuit for illustrating a test concept for the purpose of calibration of an RF transmitter/receiver test circuit such as that implemented on an RF transmitter/receiver module or riderboard. In this embodiment the input/output node of the test circuitry is coupled to a switch as was shown in the embodiment of FIG. 5 and remote from the switch the input/output node is coupled to a power monitor system. When using a module the power monitor system can be part of the module so that each module is provided with its own power monitor system. Alternatively the power monitor system can be arranged on the test board and electrically coupled to the bus system so that the modules are not provided with an own power monitor system but make use of one and the same test board power monitor system for calibration purposes.

The power monitor system as shown in FIG. 6 is used to calibrate the RF transmitter/receiver test circuitry. For this purpose the power monitor system comprises two RF power monitors designated with reference signs #1 and #2. The electrical line coupled with the input/output node of the test circuitry is provided with a directional coupler. The directional coupler can be controlled such that it couples an electrical signal out of the electrical line to either one of the two power monitors. The power monitors convert the RF signal into a DC signal according to well-known RF-to-DC direct conversion electronics.

In a first calibration mode the RF source of the loadboard, is calibrated by driving the PLL as shown in FIG. 5 and adjusting different settings of the attenuator. Then the RF power is measured with, for example, the first power monitor #1 and for each setting of the attenuator the respective measured DC signal of the first power monitor #1 is stored in a memory like, the EEPROM memory on the module or riderboard. It is also possible that each setting of the attenuator corresponds to an expected value of the RF power of the RF source or a respective expected value for the DC to be measured and that a difference between this expected DC signal value and the DC signal value as measured by the power monitor #1 is stored in the memory.

In a second calibration mode the RF detector of the test circuit is calibrated by driving the TX part 53.1 of a DUT 53 to generate RF signals of different strength and the RF signals are detected by the RF detector and at the same time the RF signals are measured by the second power monitor #2 so that the RF detector of the test circuitry is calibrated with the second power monitor #2.

In addition it is possible that calibration functions are recorded in the form of a self-test procedure. The test circuitry can be programmed by software functions or programs to conduct a self-test to calibrate the transmitter part and the receiver part. The calibration monitor of the test circuitry initiates and controls the calibration procedure and monitors the calibration status arid also serves for storing the calibration values in the memory. After completion of the calibration procedure the test circuitry is ready to perform test functions with electrical devices to be tested.

It is also possible to measure the temperature during operation as the functions and the performance of the transmitter part and the receiver part of the test circuitry can be temperature dependent. The temperature can be measured by any well-known temperature sensor implemented on the test board or on the riderboard.

Figure 7:
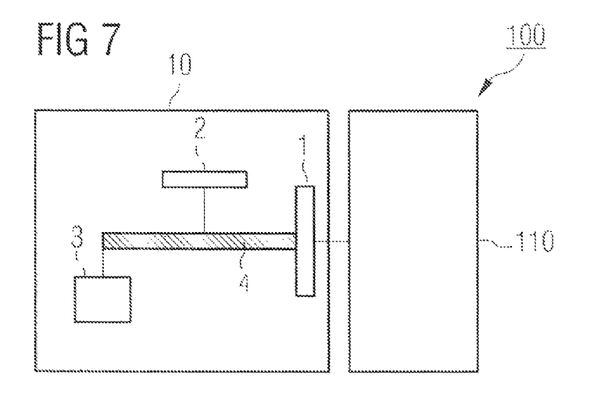
FIG. 7 schematically illustrates a test system according to an embodiment.

Referring to FIG. 7, there is shown a schematic representation of a test system according to an embodiment. The test system 100 comprises a test controller 110 and a test board 10 such as that described above in connection with FIG. 1. The test board 10 thus comprises a first interface 1 to electrically connect the test board 10 to the test controller 110, at least one second interface 2 to electrically connect the test board 10 with at least one electrical device to be tested (not shown), respectively, at least one electrical component 3, and a bus system 4 electrically connected with the first interface 1 and one or more of the second interface 2 and the electrical component 3. The bus system can also be connected between the test controller 110 and the first interface 1 of the test board 10. The test controller can be a conventional personal computer or another adequate data processing system.

According to an embodiment of the test system 100 of FIG. 7, the test controller 110 comprises software functions to enable data transfer between the test controller 110 and the test board 10 via the first interface 1. According to a further embodiment thereof the software functions are arranged to implement bus protocols, in particular standardized bus protocols, for the data transfer on the bus system 4 of the test board 10.

According to an embodiment of the test system 100 of FIG. 7, the test board 10 comprises one electrical component 3 comprising one radio frequency (RF) transmitter/receiver module, or a plurality of electrical components comprising a respective plurality of radio frequency (RF) transmitter/receiver modules.

According to an embodiment of the test system 100 of FIG. 7, the electrical component 3 is a software programmable electrical component.

Figure 8:
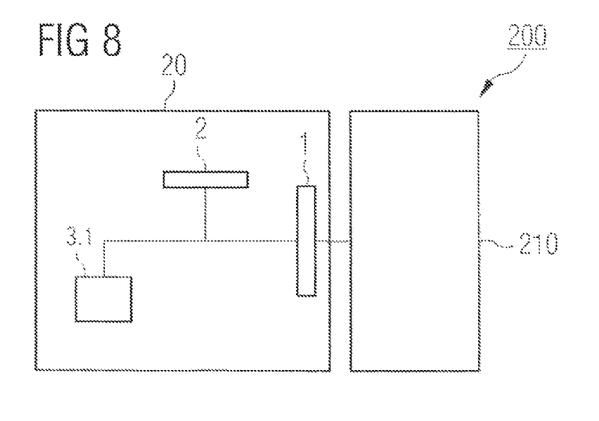
FIG. 8 schematically illustrates a test system according to an embodiment.

Referring to FIG. 8, there is shown a schematic representation of a test system according to an embodiment. The test system 200, comprises a test controller 210 and a test board 20 such as that described above in connection with FIG. 2. The test board 20 thus comprises a first interface 1 to electrically connect the test board 20 with the test controller 210, at least one second interface 2 to electrically connect the test board 20 with at least one electrical device to be tested (not shown), respectively, and at least one radio frequency (RF) transmitter/receiver module 3.1.

According to an embodiment of the test system 200 of FIG. 8, the test board 20 further comprises a bus system electrically connected with the first interface 1 and the RF transmitter/receiver module 3.1. The bus system can also be connected between the test controller 210 and the first interface 1 of the test board 20.

According to an embodiment of the test system 200 of FIG. 8, the test controller comprises software functions to enable data transfer between the test controller 210 and the test board 20 via the first interface 1. According to a further embodiment thereof the software functions are arranged to implement bus protocols, in particular standardized bus protocols, for the data transfer on the bus system.

According to an embodiment of the test system 200 of FIG. 8, the RF transmitter/receiver module 3.1 is a software programmable RF transmitter/receiver module.

Figure 9:
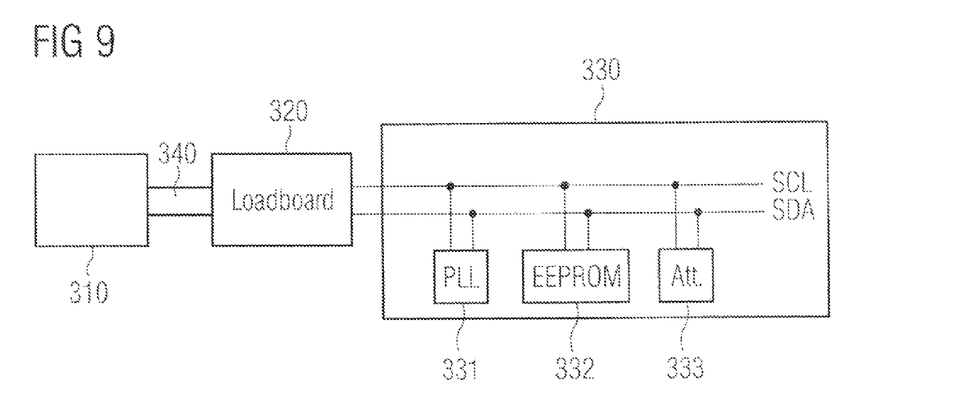
FIG. 9 schematically illustrates a test system according to an embodiment.

Referring to FIG. 9, there is shown a schematic representation of a test system according to an embodiment. The test system comprises a test controller 310, a loadboard 320 and a riderboard 330. The riderboard 330 is electrically connected with the loadboard 320. There can also be more than one riderboard connected with the loadboard 320. All components shown are interconnected by use of a bus system 340, the bus system 340 being the I²C bus system. The I²C bus system is a multi-master serial computer bus system that includes only two bidirectional open-drain lines, namely the Serial Data line (SDA) and the Serial Clock line (SCL). The riderboard 330 comprises electrical components connected with the bus system 340, namely a PLL 331, an EEPROM memory 332, and an attenuator 333. These components can be programmed and/or controlled by the test controller 310 in order to perform test functions with electrical devices to be tested or calibration tests as they were described above. There can also be further electrical components connected with the bus system 340.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A test board, comprising:
   at least one first interface configured to electrically connect the test board with a test controller, wherein the at least one first interface is directly connected to the test controller;
   at least one second interface configured to electrically connect the test board with at least one electrical device to be tested, respectively;
   at least one electrical component;
   a bus system electrically connected to the at least one first interface and the at least one second interface and the at least one electrical component, wherein the bus system is directly connected to the at least one first interface; and
   wherein the bus system is configured to implement a bus protocol to address components connected with the bus system.

2. A test board according to claim 1, wherein at least one of:
   the at least one electrical devices comprises a radio frequency (RF) transmitter/receiver module.

3. The test board according to claim 2, further comprising:
   at least one third interface connected to the at least one electrical component.

4. The test board according to claim 2, wherein the at least one electrical device comprises:
   a plurality of RF transmitter/receiver modules.

5. The test board according to claim 1, wherein at least one of the at least one electrical devices comprises a software programmable electrical component.

6. A test board, comprising:
   at least one first interface configured to electrically connect the test board with a test controller, wherein the at least one first interface is directly connected to the test controller;
   at least one second interface configured to electrically connect the test board with at least one electrical device to be tested, respectively;
   at least one radio frequency (RF) transmitter/receiver module electrically connected to the at least one first interface and the at least one second interface, and
   a bus system electrically connected between the at least one first interface and the at least one second interface and the at least one RF transmitter/receiver module, wherein the bus system is directly connected to the at least one first interface,
   wherein the test board comprises a load board.

7. The test board according to claim 6, wherein the at least one RF transmitter/receiver modules comprises a plurality of RF transmitter/receiver modules.

8. The test board according to claim 6, further comprising:
   at least one third interface connected to the at least one RF transmitter/receiver module.

9. The test board according to claim 6, wherein the at least one RF transmitter/receiver module comprises a software programmable RF transmitter/receiver module.

10. A test board, comprising:
    a first interface configured to electrically connect the test board with a test controller, wherein the first interface is directly connected to the test controller;
    a bus system electrically connected to the first interface, wherein the bus system is directly connected to the first interface;
    at least one second interface configured to electrically connect the test board with at least one electrical device to be tested, respectively; and
    at least one third interface comprising an electrical plug or a socket and electrically connected to the at least one electrical device, respectively, wherein the second and third interfaces are electrically connected with each other.

11. The test board according to claim 10, further comprising:
    a bus system electrically connected to the first interface and one or more of the at least one second interface and the at least one third interface.

12. The test board according to claim 10, wherein at least one of the electrical device comprises a radio frequency (RF) transmitter/receiver module.

13. The test board according to claim 12, wherein
    the RF transmitter/receiver module comprises a software programmable RF transmitter/receiver module.

14. The test board according to claim 10, wherein the at least one electrical device comprises a plurality of RF transmitter/receiver modules.

15. A test system, comprising:
    a test controller;
    a test board, comprising:
       a first interface configured to electrically connect the test board to the test controller, wherein the first interface is directly connected to the test controller;
       at least one second interface to electrically connect the test board with at least one electrical device to be tested, respectively;
       at least one electrical component;
       a bus system electrically connected to the first interface and one or more of the second interface and the electrical component, wherein the bus system is directly connected to the first interface; and
       a bus protocol implemented on the bus system to address components connected with the bus system.

16. The test system according to claim 15, wherein the test controller comprises software instructions configured to enable data transfer between the test controller and the test board via the first interface.

17. The test system according to claim 16, wherein the software instructions are configured to implement bus protocols for the data transfer on the bus system.

18. The test system according to claim 15, the at least one electrical device comprises one radio frequency (RF) transmitter/receiver module, or a plurality of radio frequency (RF) transmitter/receiver modules.

19. The test system according to claim 16, wherein
    the at least one electrical device comprise a software programmable electrical component.

20. A test system, comprising:
    a test controller;
    a test board, comprising:
       at least one first interface configured to electrically connect the test board with the test controller, wherein the at least one first interface is directly connected to the test controller;
       at least one second interface configured to electrically connect the test board with at least one electrical device to be tested, respectively;
       at least one radio frequency (RF) transmitter/receiver module electrically connected to the at least one first interface and the at least one second interface, and
       a bus system electrically connected to the at least one first interface and the at least one RF transmitter/ receiver module, wherein the bus system is directly connected to the at least one first interface, wherein the test board comprises a load board.

21. The test system according to claim 20, wherein the test controller comprises software instructions configured to enable data transfer between the test controller and the test board via the first interface.

22. The test system according to claim 21, wherein the software instructions are further configured to implement bus protocols for the data transfer on the bus system.

23. The test system according to claim 20, wherein the at least one RF transmitter/receiver module comprises a software programmable RF transmitter/receiver module.

24. The test board according to claim 1, further comprising:
a temperature monitor to monitor an environmental temperature.

25. The test board according to claim 1, further comprising:
a calibration unit to initiate or to control a procedure to calibrate a component of the test board.

\* \* \* \* \*